May 26, 1970 W. RUPPERT 3,514,356

METHOD OF MANUFACTURING A PRINTED CIRCUIT

Filed April 5, 1968

Inventor:
WILHELM RUPPERT
BY: Steinberg & Blake
Attys

United States Patent Office 3,514,356

Patented May 26, 1970

3,514,356
METHOD OF MANUFACTURING A PRINTED CIRCUIT

Wilhelm Ruppert, Postfach 27, 505 Wahn, Rhineland, Germany

Filed Apr. 5, 1968, Ser. No. 719,113
Int. Cl. B32b *31/00*
U.S. Cl. 156—298 9 Claims

ABSTRACT OF THE DISCLOSURE

Method for manufacturing a printed type electric circuit wherein conductor strips are connected as integral or independent strips to a plate type circuit carrier body, of insulating material, coating the conductor strips by electrically insulating varnish or lacquer (paint), simultaneously before or after said step, additionally coating the edges of said strips with a reinforcing layer of an electrically insulating coating material and then laminary pressing the strips over their cross section into the carrier body.

BACKGROUND OF THE INVENTION

The present invention relates to a method for manufacturing a printed circuit by means of strip conductors, and more particularly to a method for manufacturing printed circuits by means of strip conductors, wherein these thin strips are connected under pressure with a carrying or supporting body or base in the form of independent, individual or integral (connected) strip units. A method of this general type is used in the field of light current engineering, such as, e.g., in the electronic control of machines, in transistor radios and the like, using so-called printed circuits; these printed circuits may be manufactured in that manner that a thin copper layer is precipitated, for example, on an insulating plate, and this layer is then so prepared by etching and washing until the desired circuit is formed. Although this method saves substantial amounts of material, the printed circuit has various drawbacks. The main disadvantage is that, due to etching, the undesirable conductivity between the individual strip conductors is increased. Furthermore, the side edges of the strip conductors of printed circuits are uneven, giving rise to a comparatively high field strength which favors the formation of a leakage current between the strip conductors and thus a drop in the performance, short-circuits and no-resonant behaviour. The high field strength of the edges of the conductor strips in the printed circuit is further enhanced by that fact that the strip form, in spite of their small thickness, slightly raised portions on the surface of the base or plate and their edges protrude at least partially. With the known method, in which thin strips of metal are pressed onto Bakelite or the like and cemented on by thermoplastic means, only the edges are pressed into the plate, and also here the strip conductor protrudes more than is necessary or permissible over the plane of the plate, the high field strength edges are not screened and leakage current continue to occur.

It is already known to use other methods whereby thin conductor strips are pressed substantially completely into the surface of the support. However, this is not sufficient to guarantee a sufficient insulation, because in this case the problem of the interference created by the edges is completely ignored. However, just in a printed circuit with small gaps between conductors and long conducting paths, the perfect insulation is of the utmost importance.

SUMMARY OF THE INVENTION

It is accordingly a primary object of the present invention to provide printed circuits of above general type while eliminating the problems and drawbacks which are inherent in conventional methods.

Therefore, it is an object of the present invention to provide a method to manufacture such printed circuits in which a leakage current and corrosion is effectively avoided.

It is also an object of the present invention to be proved for an improved method to manufacture printed circuits of above general type which is more simple, requires a cheap, flat stamping piece only, can be carried out more quickly and affords a more rough handling of carrier base and printed circuit, respectively.

In accordance with the invention the conductor strips are coated by electrically insulating varnish (lacquer). The side edges of the strips are additionally coated with a sufficiently strong layer of an electrically insulating coating material and then the strips are laminary pressed over their cross section into the carrier body.

This provides also a circuit plate, part of a circuit plate or the like in which the conductor strips are thicker than those of a printed circuit, but which is not only more compact and resistant, but also offers more resistance to local leakage currents.

It is one more embodiment of the invention to provide for conductor strips to be produced with perfect unbroken edges. The electrically insulating coating may be resilient, and at least the conductor edges, and possibly also other parts of the conductors and/or adjacent parts of the carrier may be provided with the coating.

In many cases, a flexible carrier plate must be used. In this respect, the known printed circuits fail in that the very thin conductor strips, produced by precipitation methods and therefore not compactly coherent, tend to break or burst, causing a break in the circuit. This cannot happen with the construction according to the invention, because these conductor strips are made of copper, for example, in the region of 20 to 200 microns and are sufficiently ductile. Preferably a coating of paint is used which is based on, e.g., a polyamide or polyurethane, and according to another embodiment of invention, is more ductile than the material of the carrier plate. Preferably a polyvinyl acetal or terephthal polyester paint, or a heat resistant paint is used.

BRIEF DESCRIPTION OF THE DRAWINGS

The invention will be further described with reference to the accompanying drawings which illustrate the invention but in no restrictive manner.

DESCRIPTION OF PREFERRED EMBODIMENTS

The carrier member can be a body with six or more side faces, or a curved three-dimensional body. In the embodiment shown, it is a plate 10, manufactured of an electrically insulating material, such as phenolic resin cardboard, melamine epoxide, silicone resins, with inorganic fillers, such as glass fibre, of polytetrafluoroethylene or any other suitable plastic. The plate 10 has on its surface transversely, e.g., parallel strip conductors 11, 12, etc., e.g., of copper, which may have the same or different band widths. The thickness of the strip is preferably between 20 and 200 microns and is preferably of the order of up to 100 microns. The underside of the plate 10 may also have conductors 13, 14, shown by dotted lines, arranged longitudinally and again parallel to each other. However, the conductors may also extend diagonally or in zig-zag.

Figure 1:
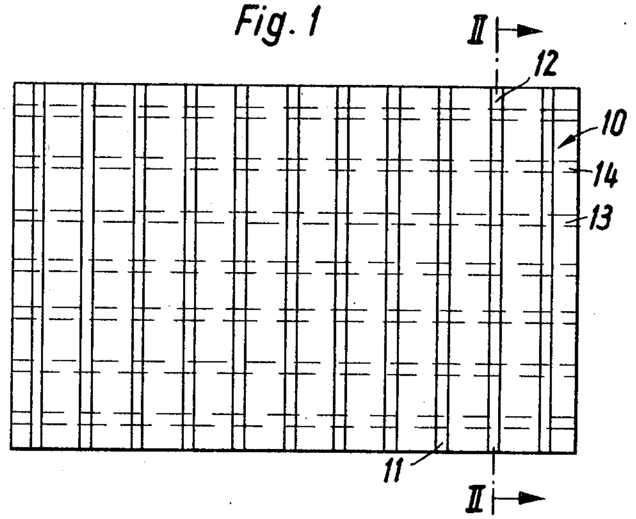
FIG. 1 is a plan view of a plate-shaped supporting member, equipped on its upper surface with transversely extending metallic conductor strips and on its upper surface with longitudinally extending metallic conductor strips.
Figure 2:
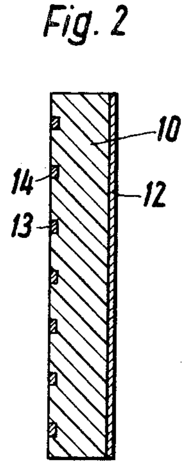
FIG. 2 is a cross-section along the line II—II in FIG. 1.
Figure 3:
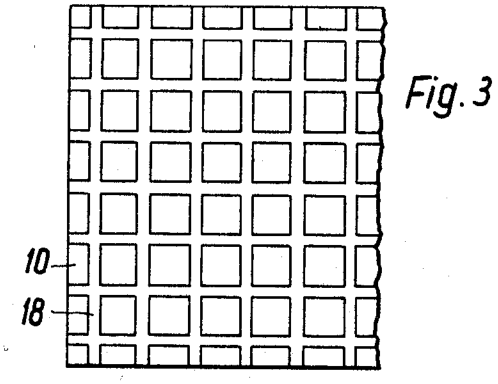
FIG. 3 is a plan view of a supporting member with grid-like strip conductors and FIG. 4 is a corresponding plan view of a plate-shaped supporting member showing a circuit produced by means of a grid-shaped field of strip conductors.
Figure 5:
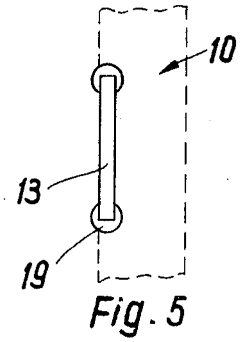
FIG. 5 shows an enlarged section of FIG. 2 and indicates diagrammatically the insulation on the edges of the strip conductors.
Figure 4:
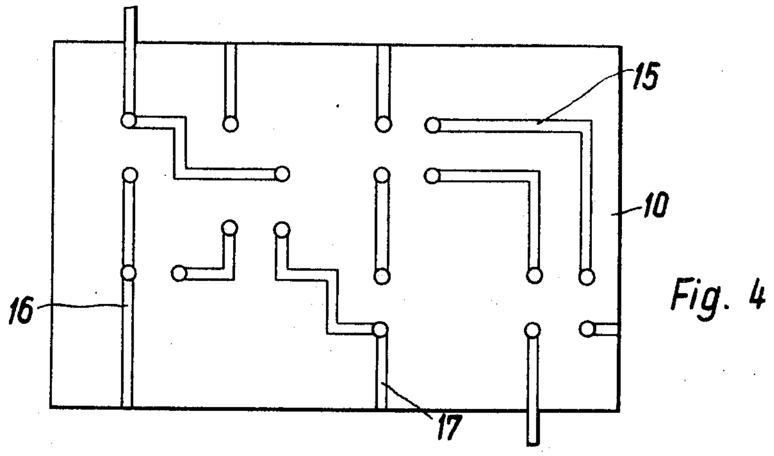

FIGS. 2 and 5 show in detail the arrangement and insulation of the conductor strips on the surface of the plate 10. Since the plate consists of resilient material the conductor strips 13 and so on are pressed into the plate, preferably, a more resistant surface is formed which offer no mechanical points of attack. Mainly, this arrangement reduces the leakage current in that the strip conductors 12, 13, 14, etc., are provided at their edges, and particularly prior to be fitted into the plate 10, with a coat of paint or varnish 19 (FIG. 5) which acts both as electrical insulation, and also reduces the possibilities of corrosion. Suitable varnishes for this purpose are formed, for example on the base of polyamides, polyurethanes, and the like, but also other synthetic resin varnishes and paints can be used. According to one embodiment of the invention, a paint is used which is more ductile, and possibly also thermally more resistant, than the material of the plate 10. If, for reasons of material economy, a thin plate 10 is used, the plate and the conductor strips are bent. Cracks and fissures may occur in the plate 10, and in this case, the ductility of the paint is sufficient and within the elasticity range, and the varnish remains undamaged.

The plate 10 may be impregnated. Furthermore, the pressing in of the conductor strips may be effected under application of heat. The transitions between the conductor strips need not necessarily be rectangular, but may comprise sectors, curved paths, and the like, such as, for example, for rotary contacts and rotary switches. The starting materials used may be, e.g., round section wires which assume during the pressing in the finished product a strip shaped, laterally widened, e.g., oval section configuration.

EXAMPLE 1

Copper strips of 0.12 mm. thickness and 20 mm. width will be tempered in heat which purifies the strip surfaces. Then the strips will be coated with an equally thin layer or polyvinylformal (which has a burning-in-residue of about 18–19% at a viscosity of 1300 cp.). The layers will be subsequently submitted to a curing process carried out at temperatures of about 200–380° centigrades. A suction efficiency of 6–10 m. per minute is applied to draw circulating gas or air along the strips, depending from strips' width. Varnish layers of 0.010–0.015 mm. thickness result from this treatment, whereas the layer thickness in the width may remain 0.006–0.008 mm. only. Then the side edges will be spray coated by nozzle means to bring the varnish thickness here at least to 0.010–0.015 mm. or above these values. Subsequently, and preferably after cooling and drying, the strips are pressed into a flat plate 10 of laminated, hard paper or the like.

EXAMPLE 2

Process similar to Example 1 in which, however, a polyesterimid is applied instead of polyvinylformal, the polyesterimid having a burned-in-residue of about 30–32% at viscosity of 1400 cp. (centipoise).

In special cases, the support and strip conductors are exposed to high temperatures. In this case, the materials are so chosen that the material of the paint is thermally more resistant than that of the carrier plate or the like. One such field is the construction of rockets. In order to screen the conductor strip as far as possible against the effects of high temperatures, the conductivity should be substantially constant with rising temperatures. In a graph, in which the ordinate shows the conductivity and the abscissa the temperature, the proposal according to the invention produces a curve which is substantially parallel to the temperature axis, whilst the ordinate value naturally rises with extreme temperatures. However, in this graph, the material of the carrier plate is subject to the faster, linear rise of the conductivity.

I claim:

1. A method for manufacturing a printed type electrical circuit in which conductor strips are connected in the form of independent, individual or integral strip units with a plate type carrier body, comprising the steps of:

coating the conductor strips by electrically insulating varnish or lacquer;

additionally coating only the side edges of the strips with a reinforcing layer of an electric insulating coating material;

and then pressing laminary the strips over their cross-section into the carrier body.

2. The combination of claim 1 and wherein coating of the edges is carried out simultaneously with coating of lower and upper strip sides.

3. The combination of claim 1 and wherein the strips prior to and the varnish during the coating are submitted to heat treatment.

4. The combination of claim 1 and wherein the strip conductor coating is a polyamide, polyurethane, polyvinyl acetal or terephthal polyester varnish.

5. The combination of claim 1 and wherein the strip conductor coating has a greater ductility than the carrier body.

6. The combination of claim 1, wherein the material for the carrier body is an epoxide and/or polyester resin, or a heat resistant varnish.

7. The combination of claim 1 wherein the strip conductor coating is a varnish which is thermally more resistant than the material of the carrier plate.

8. The combination of claim 1 and wherein a polyvinylformal or polyesterimid is used for coating, and the coating layer will be cured out at temperatures of 200–380 centigrades.

9. The combination of claim 1 and wherein the varnish is sprayed upon the edges of the strips.

References Cited

UNITED STATES PATENTS

| | | | |
|---|---|---|---|
| 2,734,150 | 2/1956 | Beck | 174—68.5 |
| 3,133,773 | 5/1964 | Ecker. | |

OTHER REFERENCES

Funk-Technik, Starrverdrahtung, No. 24, 1947, pp. 12 and 13.

ROBERT F. STAHL, Primary Examiner

U.S. Cl. X.R.

156—303.1, 314, 326; 174—86.5; 317—101